United States Patent [19]

Yamanashi et al.

[11] Patent Number: 5,300,553
[45] Date of Patent: Apr. 5, 1994

[54] METHOD OF PRODUCING ELECTRICALLY CONDUCTIVE COMPOSITE

[75] Inventors: Hidenori Yamanashi; Makoto Katsumata; Toshiaki Kanno, all of Shizuoka, Japan

[73] Assignee: Yazaki Corporation, Tokyo, Japan

[21] Appl. No.: 960,646

[22] Filed: Oct. 14, 1992

[30] Foreign Application Priority Data

Oct. 15, 1991 [JP] Japan .................................. 3-266060

[51] Int. Cl.$^5$ ................................................ C08K 3/04
[52] U.S. Cl. ..................................... 524/496; 428/408
[58] Field of Search .......................... 428/408; 524/496

[56] References Cited

U.S. PATENT DOCUMENTS 3,492,197  1/1970  Olstowski et al. .................. 428/408
4,946,892  8/1990  Chung ................................. 524/847

Primary Examiner—Paul R. Michl
Assistant Examiner—Edward Cain
Attorney, Agent, or Firm—Nikaido, Marmelstein, Murray & Oram

[57] ABSTRACT

A method of producing electrically conductive composite. Powdery graphite intercalated compound is dry-mixed with powdery thermosetting plastics to produce a powdery mixture of composition, and then the powdery mixture is compressed, while being heated, to become an electrically conductive composite.

20 Claims, No Drawings

METHOD OF PRODUCING ELECTRICALLY CONDUCTIVE COMPOSITE

BACKGROUND OF THE INVENTION

1. Field of the Invention

The present invention relates to a method of producing an electrically conductive composite which is formed into various electrically conductive molded shapes.

2. Prior Art

In recent advanced electronics, shielding materials having lighter weight and higher electrical conductivity play an important role in shielding static electricity and electromagnetic liquids. The shielding materials include resin composites where metal powder, carbon powder, or fibers are mixed with plastics or rubber. Of these materials, resin composite with metal mixed therein is heavy and expensive. Electrically conductive materials of the carbon family are generally of lighter weight but are less conductive than those of the metal family. Thus, if a shielding-material having high electrical conductivity is to be made from particle like carbon materials, such as carbon black, more carbon material must be used to produce a unit amount of shielding material. A larger amount of carbon results in less machinability of the material and causes electrical conductivity to change due to shear force imposed on particle during milling or molding of the material. Therefore, it is difficult to obtain a shielding material with stable, uniform properties.

For higher electrical conductivity, resin composites have been proposed where rubber or plastics, for example, are mixed with electrically conductive materials such as graphitized carbon and graphite intercalated compounds obtained by mixing the graphitized carbon with metal salt, nitric acid, halogen, or alkali metals. However, these graphite intercalated compounds become generally unstable when heated and loses mechanical strength. They are decomposed or destroyed when they are milled with synthetic resin, making it difficult to produce resin composites having stable properties with good production repeatability.

SUMMARY OF THE INVENTION

An object of the present invention is to provide a method of producing an electrically conductive composite with good production repeatability. Another object of the present invention is to provide a method of producing an electrically conductive composite of lighter weight which is made of relatively unstable and mechanically breakable graphite intercalated compounds.

In the method according to the invention, powdery graphite intercalated compound is dry-mixed with powdery thermosetting plastics to produce a powdery mixture of these components, and then the powdery mixture is compressed, while being heated, to become an electrically conductive composite.

DETAILED DESCRIPTION OF THE INVENTION

The powdery thermosetting plastics used in the present invention are those which retain a solid form at temperatures ranging from room temperature to 100 degrees Celsius, particularly at room temperature. This type of synthetic resin includes phenolic resin, furan resin, epoxy resins and unsaturated polyester resins. Of which, the phenolic resins is preferably used for physical and chemical properties of molded shapes. The particle size of the resin powder is preferably below 100 microns, though not strictly required, for good dispersion mixing with the powdery graphite intercalation compound. The powdery graphite intercalation compound in the present invention is used to provide the resultant composite with electrical conductivity. For example, the powdery graphite intercalated compound may be produced through chemical reaction where a host material, such as graphite having good crystalline regularity, is caused to react with halogens, acids, metallic halides, or alkali metals. The host material includes flake natural graphite, artificial graphite, carbon-fiber grown in the gas phase, and graphite fiber. The halogen includes bromine and fluorine. The acids include sulfuric acid and nitric acid. The metallic halides includes arsenic fluoride(V), titanium fluoride(VI), vanadium(V) fluoride, ferric chloride(III), cupric chloride(II), and manganous(II) chloride. The alkali metals include potassium and cesium. Graphite intercalated compounds, obtained through chemical reaction where bromine reacts with carbon fiber grown in gas phase, are preferably employed because of their chemical stability and electrical conductivity. Depending on the chemical properties of the chemical elements used, various reaction conditions and methods may be selectively employed. The methods include two-bulb method, mix-, dip-, electrical-, chemical-, molten salt-, and solvent methods. The particle size of the resin powder is below 100 microns and is preferably below 50 microns, though not strictly required, for good dispersion mixing with the powdery thermosetting plastics.

Dry-mixing apparatuses such as a ball mill, Henschel mixer, and V type blender may be utilized to mix powdery graphite intercalated compound with powdery thermosetting plastics. The mixing apparatus could be of any type if the compounds and resin are mixed uniformly without shear forces imposed on the particles.

The mixture is formed into a shape through pressing the powder while the mixture undergoes heating, and forming a shaped article at pressures of more than 30 kg/cm2. The greater the mixing ratio of powdery graphite intercalated compound is, the higher the pressure is required. Thus, the mixing ratio of powdery graphite intercalated compounds should be below 80 weight %, and is preferably in the range of 20-60 weight %.

The mixture in the present invention may further contain additives such as processing aid, reactive monomer, crosslinker, catalyst, and antioxidant, and other electrically conductive materials such as metal powder, metal fiber, carbon black, and graphite fiber. However, too much of the additives should not be added if they are of a liquid type. Adding an excess amount of a liquid material, such as solvent, will not hold the mixture in a powder condition, causing the dispersion condition to change. Moreover, the properties of the graphite intercalated compound will change, making it difficult to produce shapes having stable properties.

The present invention provides molded resin articles having good electrical conductivity. The resin molds are produced by hot pressing the powder mixture obtained by dry-mixing powder resin and powdery graphite intercalated compound. The powdery graphite intercalated compounds will not exhibit good electrical conductivity if the materials are mixed through wet-mixing.

INTERCALATION COMPOUNDS

Carbon fiber grown in gas phase having diameters of 0.1–0.5 microns and lengths of 1–10 microns, was produced from benzene through a vapor phase thermal cracking process in the presence of metal fine particle as catalyst for heat decomposition. The Carbon fiber grown in gas phase is then graphitized at 2,400 degrees Celsius. The graphitized fiber was then immersed in liquid bromine at room temperature for 48 hours. The graphitized fiber was then transferred into a closed container in which sodium thiosulfate was present, and was left in the container for 24 hours to eliminate excess bromine therefrom, thereby producing an intercalated compound X in the form of fiber.

ELECTRICALLY CONDUCTIVE COMPOSITE A ACCORDING TO THE INVENTION

Powder-like phenolic resin(Gunei Kagaku Kogyo, PAG 2165) of 60 w % and the aforementioned intercalated compound X of 40 w % were mixed. The mixture was then agitation-mixed for three minutes at 300 rpm by the use of a planetary ball mill (Model P-5.) This powder mixture was press-formed for 20 minutes at a temperature of 150 degress Celsius and under a pressure of 500 kg-cm2 to produce an electrically conductive composite A of a dimension of 70×10×2 millimeters according to the invention.

ELECTRICALLY CONDUCTIVE COMPOSITE B FOR COMPARISON

The aforementioned intercalated compound X was mixed with a liquid type phenolic resin(Gunei Kagaku Kogyo PL 2211) diluted with solvent, instead of powder phenolic resin used for composite A, so that the intercalated compound X was 40 w % and the solid portion of the phenolic resin was 60 w %. The mixture was then passed three times through a three-roll mill. Then, the mixture was dried to produce a powder mixture composition. This powder mixture composite was press-formed through the same manufacturing conditions as in the composite A to produce an electrically conductive composite B for comparison.

ELECTRICALLY CONDUCTIVE-COMPOSITE C FOR COMPARISON

Powder-like phenolic resin (Gunei Kagaku Kogyo, PAG 2165) of 60 w % and the aforementioned intercalated compound X of 40 w % were mixed. Then, the thus produced mixture was further mixed with methanol. The amount of the methanol was 10 w % of the aforementioned mixture of powder phenolic resin and the intercalated compound X. The resultant mixture was molded into an electrically conductive composite C in exactly the same procedures and conditions as in the electrically conductive material B.

COMPARISON IN ELECTRICAL CONDUCTIVITY AMONG COMPOSITES A, B, AND C

The electrical resistances of the aforementioned three composites were measured through the four-terminal method and then the specific resistances of the composites were determined as shown in Table 1.

TABLE 1

| Composites | Specific resistance (ohm-cm) |
|---|---|
| A | $8.1 \times 10^{-2}$ |
| B | $1.6 \times 10^{-1}$ |
| C | $1.5 \times 10^{-1}$ |

INDUSTRIAL APPLICABILITY

Synthetic resin composites having light weight and high electrical conductivity can easily be obtained without sacrificing good conductivity of graphite intercalated compounds.

What is claimed is:

1. A method for manufacturing an electrically conductive solid composite, comprising the steps of:
   dry-mixing a powdery graphite intercalation compound and a powder thermosetting plastic to produce a composition consisting essentially of dry mixed powder; and
   hot-pressing said composition to mold such into an electrically conductive solid composite of a desired shape having improved electrical conductivity.

2. A method for manufacturing an electrically conductive solid composite, comprising the steps of:
   dry-mixing powdery graphite intercalated compound of 60–20 weight % and powder thermosetting plastics of 40–80 weight % to produce a composition consisting essentially of dry mixed powder; and
   hot pressing said composition to mold such into an electrically conductive solid composite of a desired shape having improved electrical conductivity.

3. The method for manufacturing an electrically conductive solid composite according to claim 2, wherein said powdery graphite intercalation compound comprises graphitized fibrous carbon.

4. The method as claimed in claim 3 wherein said graphite is intercalated with at least one member selected from the group consisting of halogens, acids, metallic halides, and alkali metals.

5. The method as claimed in claim 4 wherein said halogen member is selected from fluorine, and bromine.

6. The method as claimed in claim 4 wherein said member is bromine.

7. The method as claimed in claim 4 wherein said metallic halide member is selected from arsenic fluoride, titanium fluoride, vanadium fluoride, ferric chloride, cupric chloride, and manganous chloride.

8. The method as claimed in claim 4 wherein said acid member is selected from sulfuric acid and nitric acid.

9. The method as claimed in claim 4 wherein said alkali member is selected from cesium and potassium.

10. The method as claimed in claim 3 wherein said graphite is at least one member selected from the group consisting of flake natural graphite, artificial graphite and fiber grown from carbon in the vapor phase.

11. The method for manufacturing an electrically conductive solid composite according to claim 3, wherein said powder composition consists essentially of 40 weight % vapor grown carbon fiber and 60 weight % powdery phenolic resin.

12. The method as claimed in claim 1 including further admixing said composition with at least one additional member selected from the group consisting of processing aid, reactive monomer, crosslinker, catalyst, and antioxidant.

13. The method as claimed in claim 12 wherein at least one of said additional members is liquid in a quantity which is insufficient to substantially adversely affect the electrical resistivity of said shaped product.

14. In a method of forming an electrically conductive solid article comprising:

admixing a conductive graphite component and a plastic binder component; and compression molding said admixture under conditions sufficient to form a shaped article therefrom; the improvement, whereby said shaped article has higher electrical conductivity and greater stability, which comprises:

said conductive graphite component comprising particles of a dry graphite intercalation compound having increased electrical conductivity;

said plastic binder component comprising particles of a dry thermosetting resin; and said admixture is substantially dry.

15. The improved method as claimed in claim 14 wherein said graphite intercalation compound is bromine intercalated into vapor grown carbon fibers which have been graphitized.

16. An electrically conductive shaped solid composite of improved electrical conductivity produced by a method comprising the steps of:

dry-mixing a powdery graphite intercalation compound with and a powder thermosetting synthetic resin to produce a composition consisting essentially of a dry mixed powder; and hot-pressing said composition to mold such into said shaped solid composite of improved electrical conductivity.

17. An electrically conductive shaped article as claimed in claim 16 wherein said graphite intercalation compound comprises a bromine intercalated into vapor grown carbon fiber.

18. An electrically conductive shaped article as claimed in claim 16 in the shape of an electrically conducting element.

19. An electrically conducting shaped article as claimed in claim 18 in the shape of a bus-bar.

20. An electrically conducting shaped article as claimed in claim 18 in the shape of a terminal for an electrical connector.

* * * * *